United States Patent
Chen et al.

(10) Patent No.: US 6,587,999 B1
(45) Date of Patent: Jul. 1, 2003

(54) MODELING DELAYS FOR SMALL NETS IN AN INTEGRATED CIRCUIT DESIGN

(75) Inventors: Lei Chen, Mountain View, CA (US); Sandeep Bhutani, Towson, MD (US); Nianging Zhang, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/859,149

(22) Filed: May 15, 2001

(51) Int. Cl.[7] .............................................. G06F 9/45
(52) U.S. Cl. ................ 716/6; 716/5; 716/10; 716/17; 716/18
(58) Field of Search .................. 716/4–6, 10–13, 716/16–18

(56) References Cited

U.S. PATENT DOCUMENTS

| | | | | |
|---|---|---|---|---|
| 5,841,672 A | * | 11/1998 | Spyrou et al. ................ | 716/6 |
| 5,875,114 A | * | 2/1999 | Kagatani et al. ............ | 716/6 |
| 6,182,269 B1 | * | 1/2001 | Laubhan ....................... | 716/5 |
| 6,253,361 B1 | * | 6/2001 | Buch ............................ | 716/6 |
| 6,272,668 B1 | * | 8/2001 | Teene ........................... | 716/10 |
| 6,327,542 B1 | * | 12/2001 | McBride ....................... | 716/5 |
| 6,401,233 B1 | * | 6/2002 | Suzuki et al. ................ | 716/13 |
| 6,408,426 B1 | * | 6/2002 | Josephson et al. ........... | 716/12 |
| 2002/0016950 A1 | * | 2/2002 | Sakamoto ..................... | 716/6 |
| 2002/0095646 A1 | * | 7/2002 | Ohkubo ........................ | 716/6 |

* cited by examiner

Primary Examiner—Steven Loke
Assistant Examiner—Quang Vu
(74) Attorney, Agent, or Firm—Fitch, Even, Tabin & Flannery

(57) ABSTRACT

A method of modeling delays in an integrated circuit design is disclosed that may be used to reduce the computation time of path delays in an integrated circuit design. A method of modeling delays in an integrated circuit design includes the steps of receiving as input a description of an integrated circuit design; identifying at least one small net in the integrated circuit design from the description; approximating an effective capacitance of the at least one small net by the total capacitance; and approximating an interconnect delay of the at least one small net by zero.

23 Claims, 2 Drawing Sheets

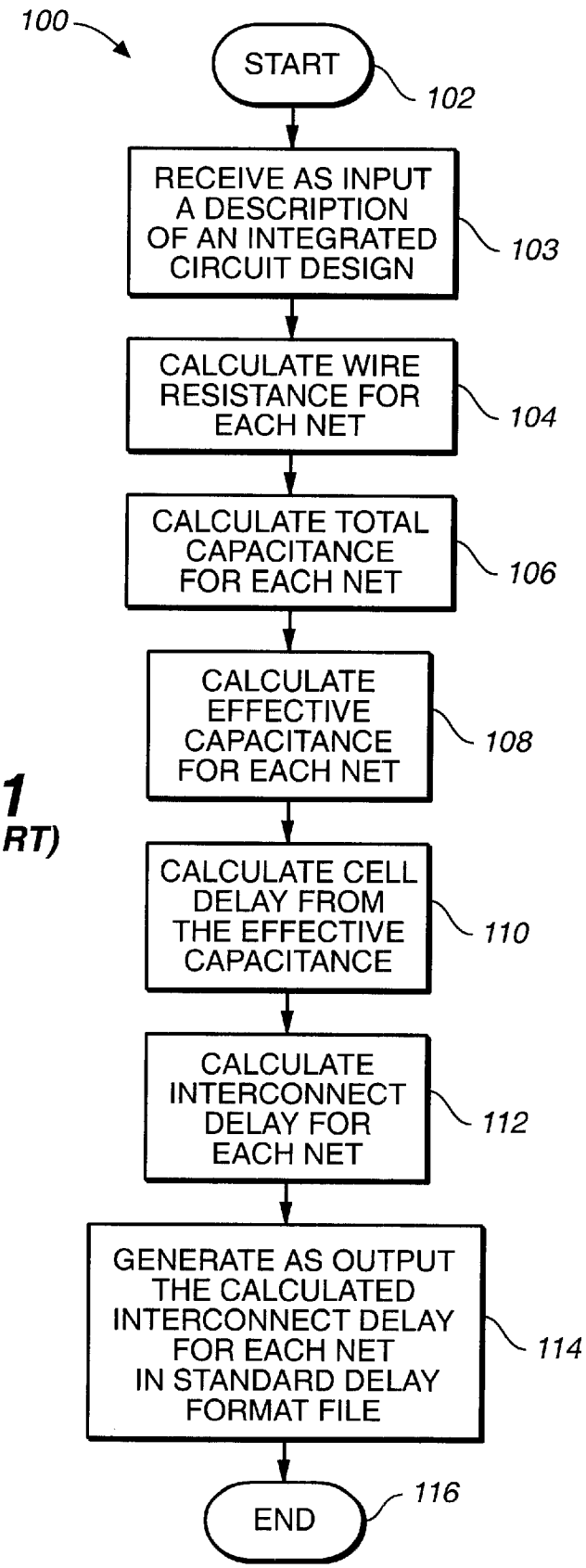
FIG._1
*(PRIOR ART)*

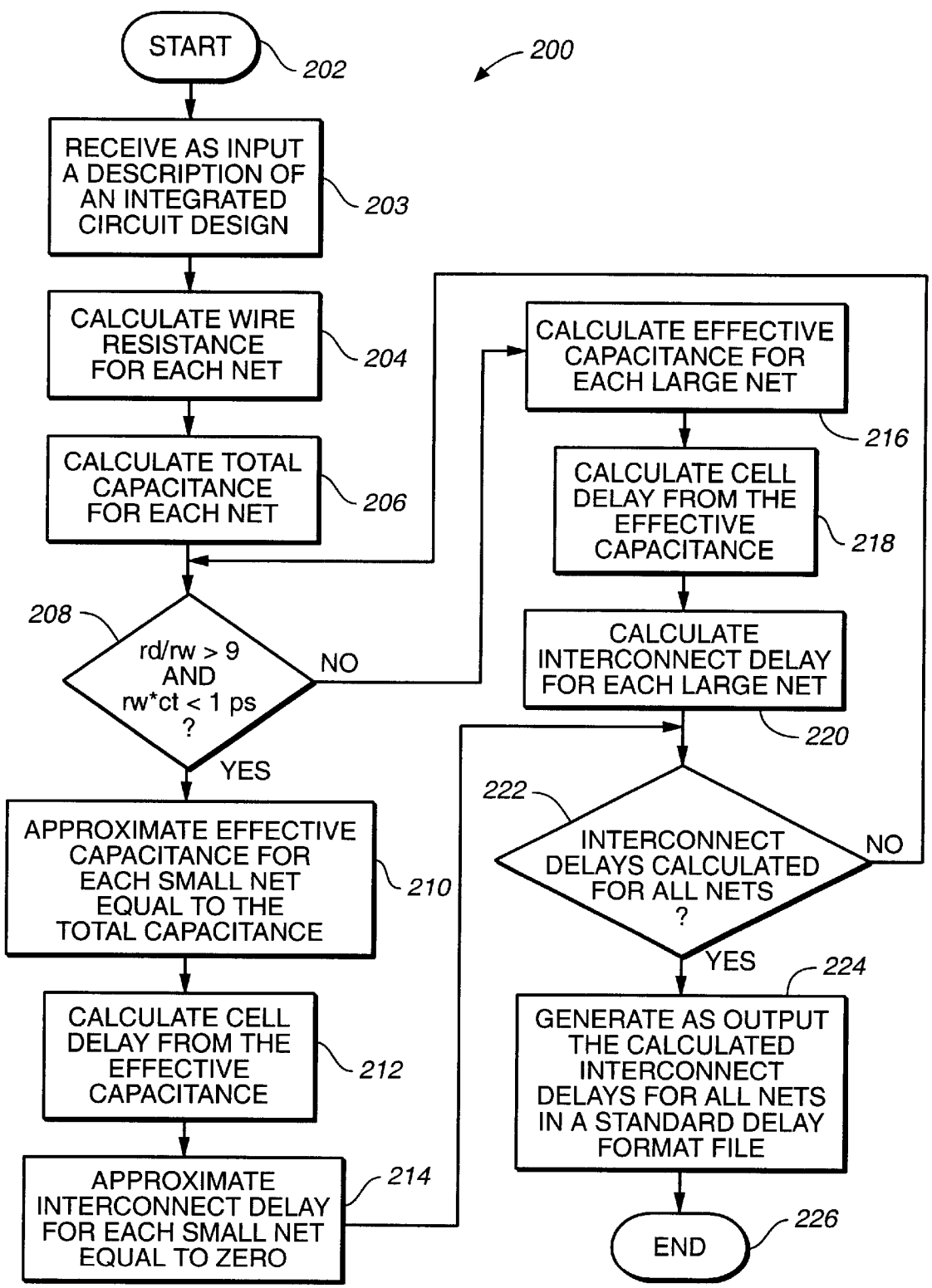
FIG._2

MODELING DELAYS FOR SMALL NETS IN AN INTEGRATED CIRCUIT DESIGN

BACKGROUND OF THE INVENTION

The present invention relates generally to electronic circuit design using computer simulation techniques. More specifically, but without limitation thereto, the present invention relates to modeling delays of a circuit element driving a distributed resistance-capacitance network in an integrated circuit.

Methods for modeling the output waveform of a circuit element or cell driving a resistance-capacitance network generally use a Thevenin equivalent model, i.e., a voltage source in series with a resistance, and a load having a single effective capacitance. However, previous methods typically calculate an effective capacitance (Ceffective) and an interconnect delay for each intrinsic arc. The calculation of effective capacitance consumes about 30 percent of the total delay computation time, and the calculation of interconnect delays using AWE is also extremely time-consuming.

SUMMARY OF THE INVENTION

The present invention advantageously addresses the needs above as well as other needs by providing a method of modeling cell delay in an integrated circuit design that may be used to reduce the total computation time.

In one embodiment, the invention may be characterized as a method of modeling delays in an integrated circuit design that includes the steps of receiving as input a description of an integrated circuit design; identifying at least one small net in the integrated circuit design from the description; approximating an effective capacitance of the at least one small net by the total capacitance; and approximating an interconnect delay of the at least one small net by zero.

In another embodiment, the invention may be characterized as a computer program product that includes a medium for embodying a computer program for input to a computer and a computer program embodied in the medium for causing the computer to perform the following functions: receiving as input a description of an integrated circuit design; identifying at least one small net in the integrated circuit design from the description; approximating an effective capacitance of the at least one small net by the total capacitance; and approximating an interconnect delay of the at least one small net by zero.

In still another embodiment, the invention may be characterized as a method of modeling cell delays in an integrated circuit design that includes the steps of receiving as input a description of an integrated circuit design; calculating a wire resistance for each of a plurality of nets in the description of the integrated circuit design; calculating a total capacitance for each of the plurality of nets; identifying a plurality of small nets in the plurality of nets; approximating an effective capacitance for each of the plurality of small nets by the total capacitance; approximating an interconnect delay for each of the plurality of small nets by zero; and calculating a cell delay from the interconnect delay and the effective capacitance for each of the plurality of small nets.

The features and advantages summarized above in addition to other aspects of the present invention will become more apparent from the description, presented in conjunction with the following drawings.

BRIEF DESCRIPTION OF THE DRAWINGS

FIG. 1 is a flowchart of a conventional delay calculation program of the prior art that calculates effective capacitance and interconnect delay to model cell delay, for an integrated circuit design; and FIG. 2 is a flowchart illustrating a method according to an embodiment of the present invention to reduce delay computation time.

Corresponding reference characters indicate corresponding elements throughout the several views of the drawings.

DETAILED DESCRIPTION OF THE EMBODIMENTS

One of the difficulties encountered in the design of a complex integrated circuit is the modeling of the delay of each net to simulate how the integrated circuit will perform to detect and correct problems before committing to a hardware layout. Cell delays have been modeled by computing an effective capacitance and an interconnect delay for each net in the integrated circuit, but these computations are generally quite costly in terms of computer resources and contribute significantly to the total cost of the integrated circuit product. For example, the effective capacitance of each net is typically calculated by iterating a series of computations in a loop until a desired delay tolerance is reached. Also, the interconnect delay of each net is typically calculated using AWE software. Both of these calculations require a long time for a computer especially for large circuit designs.

FIG. 1 is a flowchart 100 of a conventional delay calculation program. The conventional delay calculation program receives as input a standard description of an integrated circuit design, calculates cell and wire connect delays, and generates the calculated values as output in Standard Delay Format (SDF) files that are suitable for back-annotation for supported Verilog/verilog Hadware Description Language (VHDL)/IKOS Systems simulators and/or the Primetime static timing analyzer. Both third party macrocells and memories with delays are annotated, and a separate Standard Delay Format file is created for each combination of precess, voltage, and temperature conditions. The Primetime static analyzers and Verilog/VHDL/IKOS simulators use the back-annotated SDF information to generate accurate static timing and simulation results, respectively.

Step 102 is the entry point for the flowchart 100.

In step 103, a standard description of an integrated circuit design is received as input.

In step 104, the wire resistance (rw) is calculated for each net of the integrated circuit design. The wire resistance (rw) is the total resistance of a specific net that includes the resistance from the output pin of the driving cell through all the interconnect wires to the input pin of the receiving cell. The wire resistance is calculated from post layout information or from a pre-layout approximation according to well known techniques.

In step 106, the total capacitance (ct) is calculated for each net. The total capacitance is the total of all capacitances on a specific net, including interconnect wire capacitance and input capacitance of the receiving cell. The total capacitance (ct) is calculated from post layout information or from a pre-layout approximation according to well known techniques.

In step 108, the effective capacitance is calculated for each net from the wire resistance calculated in step 104 and the total capacitance calculated in step 106 according to well known techniques.

In step 110, the cell delay is calculated from the effective capacitance calculated in step 108 according to well known techniques.

In step 112, the interconnect delay is calculated from the cell delay calculated in step 110, typically by AWE (asymptotic waveform evaluation) according to well known techniques.

In step 114, the calculated values of the interconnect delay for each net are generated as output in a Standard Delay Format (SDF) file.

Step 116 is the exit point for the flowchart 100.

A substantial savings in the time required to compute cell delays may be realized by identifying a subset of nets in the integrated circuit for which a simple approximation of effective capacitance and interconnect delays may be made that closely matches the results from lengthy computations. The nets in this subset are called small nets for convenience.

One condition for identifying small nets is that when the ratio of the net driver resistance (rd) to the net wire resistance (rw) is high, then the resistance shielding effect is negligible. The resistance shielding effect results from the wire resistance inherent to every interconnect that directly affects the capacitance of the receiver and wire as seen by the driver. For a smaller wire resistance, the driver sees an effective capacitance that is close to the total capacitance. For a larger wire resistance, the driver sees an effective capacitance that is much smaller than the total capacitance. The condition that rd >> rw is not sufficient for identifying small nets, however, because the effect of wire delay is not negligible.

A first order approximation of wire delay may be made by calculating the total capacitance (ct) and the wire resistance (rw). The product (rw*ct) of the wire resistance (rw) times the total capacitance (ct) gives a first order approximation of the wire delay.

Because of the resistance shielding effect, the total capacitance (ct) is typically greater than the effective capacitance, resulting in a conservative (high delay) cell delay model. Other effective capacitance algorithms may yield an effective capacitance that is greater than the total capacitance (ct), resulting in an aggressive (low delay) cell delay model, however the magnitude of the delay is so small that the overall delay is not significantly affected. If the ratio (rd/rw) of the driver resistance (rd) to the wire resistance (rw) is greater than a selected minimum ratio, and if (rw*ct) is less than a selected minimum wire delay, then the net may be identified as a small net. For a small net, the interconnect delay is negligible and may be set to zero. The driver resistance may be obtained from the dependence of the driver output waveform $V_0$ on the input waveform v(t) given by the following formula:

$$v(t) = V_0 * e^{-(t/rd \cdot cl)} \quad (1)$$

where rd is the driver resistance and cl is the maximum gate capacitance. The driver resistance is then given by the following relation:

$$rd = (t10(cl) - t50(cl))/(cl * \log 5) \quad (2)$$

where t10(cl) is the input switching threshold voltage corresponding to a rising output voltage waveform of 10 percent of Vdd, and t50(cl) is the input switching threshold voltage corresponding to a rising output voltage waveform of 50 percent of Vdd. For the falling output voltage waveform, t10(cl) is replaced by t90(cl), the input switching threshold voltage corresponding to a rising output voltage waveform to 90 percent of Vdd.

The two conditions for identifying small nets may be expressed as follows:

(1) $rw*ct <$ a selected minimum delay  (3)

(2) $rd/rw >$ a selected minimum ratio

A suitable value discovered by the inventors for the selected minimum delay is 1 picosecond. Likewise, a suitable value discovered by the inventors for the selected minimum ratio is nine. For each small net in the description of the integrated circuit design identified by satisfying the two conditions above, the corresponding total capacitance may be substituted for the corresponding effective capacitance calculation, and an interconnect delay of zero may be substituted for the interconnect delay calculation. The greater the number of small nets, the greater the number of substituted calculations and corresponding savings in computation time. The inventors have found that substituting the total capacitance for the effective capacitance calculation and a zero interconnect delay for the interconnect delay calculation of small nets in a variety of integrated circuit designs results in only a minimal shift in the percentage error compared with HSPICE circuit simulation software.

FIG. 2 is a flowchart 200 illustrating a method of modeling cell delays according to an embodiment of the present invention that reduces computation time in the delay calculations for each cell in an integrated circuit design.

Step 202 is the entry point for the flowchart 200.

In step 203, a standard description of an integrated circuit design is received as input.

In step 204, a corresponding wire resistance is calculated for each net in the integrated circuit design as described for step 104 in FIG. 1.

In step 206, a corresponding total capacitance is calculated for each net as described for step 106 in FIG. 1.

In step 208, if the ratio of the corresponding driver resistance to the corresponding wire resistance of a net is greater than the selected minimum ratio, and if the product of the corresponding wire resistance times the corresponding total capacitance of the net is less than the selected minimum wire delay, then the net is identified as a small net, and processing continues at step 210. Otherwise, the net is identified as a large net, and processing continues at step 216.

In step 210, the effective capacitance for each small net identified in step 208 is approximated by the total capacitance.

In step 212, the cell delay for each small net is calculated from the effective capacitance.

In step 214, the interconnect delay for each small net is approximated by zero, and processing continues from step 222.

In step 216, the effective capacitance for each large net is calculated from the wire resistance calculated in step 204 and the total capacitance calculated in step 206 according to well known techniques.

In step 218, the cell delay for each large net is calculated from the effective capacitance calculated in step 216 according to well known techniques.

In step 220, the interconnect delay for each large net is calculated using, for example, AWE (asymptotic waveform evaluation) according to well known techniques.

In step 222, if the interconnect delays for all nets in the integrated circuit design have been calculated, processing continues from step 224. Otherwise, processing continues from step 208.

In step 224, the calculated values of the interconnect delay for each net are generated as output in a Standard Delay Format file.

Step 226 is the exit point for the flowchart 200.

Although the method illustrated in the flowchart 200 has been described and shown with reference to specific steps performed in a specific order, these steps may be combined, sub-divided, or reordered without departing from the scope of the claims. Unless specifically indicated herein, the order and grouping of steps is not a limitation of the present invention.

The method illustrated in the flowchart 200 for modeling cell delay may be embodied in a computer program product and implemented by a computer according to well known programming techniques to perform the following functions: receiving as input a description of an integrated circuit design; identifying at least one small net in the integrated circuit design from the description; approximating an effective capacitance of the at least one small net by the total capacitance; and approximating an interconnect delay of the at least one small net by zero.

The cell delay may then be calculated according to well known techniques from the effective capacitance and interconnect delay of each net in the integrated circuit design, however the number of computations may be substantially reduced according to the number of small nets for which the effective capacitance is set equal to the corresponding total capacitance and the interconnect delay is set equal to zero.

The method of modeling cell delay in an integrated circuit design described above may also be used advantageously with other cell delay modeling tools in a manner similar to that described above.

Other modifications, variations, and arrangements of the present invention may be made in accordance with the above teachings other than as specifically described to practice the invention within the spirit and scope defined by the following claims.

What is claimed is:

1. A method of modeling cell delays in an integrated circuit design comprising the steps of:
   (a) receiving as input a description of an integrated circuit design;
   (b) identifying at least one small net in the integrated circuit design from the description;
   (c) approximating an effective capacitance of the at least one small net by a total capacitance; and
   (d) approximating an interconnect delay of the at least one small net by zero.

2. The method of claim 1 wherein step (b) comprises comparing a ratio of a driver resistance to a wire resistance of each of a plurality of nets in the integrated circuit design with a selected minimum ratio.

3. The method of claim 2 wherein the selected minimum ratio is substantially equal to nine.

4. The method of claim 2 wherein step (b) comprises comparing a product of the wire resistance times a total capacitance of each of the plurality of nets in the integrated circuit design with a selected minimum wire delay.

5. The method of claim 4 wherein the selected minimum wire delay is substantially equal to one picosecond.

6. The method of claim 4 further comprising the step of (e) calculating a cell delay from the effective capacitance of the at least one small net.

7. The method of claim 6 further comprising the step of (f) calculating a cell delay and an interconnect delay for at least one large net in the plurality of nets in the integrated circuit design wherein the at least one large net is one of the plurality of nets not identified as the at least one small net.

8. The method of claim 7 further comprising the step of (g) generating as output the interconnect delay calculated for the at least one small net and the interconnect delay calculated for the at least one large net in a Standard Delay Format file.

9. A computer program product comprising:
   a medium for embodying a computer program for input to a computer; and
   a computer program embodied in the medium for causing the computer to perform at least one of the following functions:
      (a) receiving as input a description of an integrated circuit design;
      (b) identifying at least one small net in the integrated circuit design from the description;
      (c) approximating an effective capacitance of the at least one small net by a total capacitance; and
      (d) approximating an interconnect delay of the at least one small net by zero.

10. The computer program product of claim 9 wherein step (b) comprises comparing a ratio of a driver resistance to a wire resistance for each of a plurality of nets in the integrated circuit design with a selected minimum ratio.

11. The computer program product of claim 10 wherein the selected minimum ratio is substantially equal to nine.

12. The computer program product of claim 10 wherein step (b) comprises comparing a product of the wire resistance times a total capacitance for each of the plurality of nets in the integrated circuit design with a selected minimum wire delay.

13. The computer program product of claim 12 wherein the selected minimum wire delay is substantially equal to one picosecond.

14. The computer program product of claim 12 further comprising the step of (e) calculating a cell delay from the effective capacitance of the at least one small net.

15. The computer program product of claim 14 further comprising the step of (f) calculating a cell delay and an interconnect delay for at least one large net in the plurality of nets in the integrated circuit design wherein the at least one large net is one of the plurality of nets not identified as the at least one small net.

16. The computer program product of claim 15 further comprising the step of (g) generating as output the interconnect delay and the cell delay calculated for the at least one small net and the interconnect delay and the cell delay calculated for the at least one large net in a Standard Delay Format file.

17. A method of modeling cell delays in an integrated circuit design comprising the steps of:
   (a) receiving as input a description of an integrated circuit design;
   (b) calculating a wire resistance for each of a plurality of nets from the description;
   (c) calculating a total capacitance for each of the plurality of nets;
   (d) identifying a plurality of small nets in the plurality of nets;
   (e) approximating an effective capacitance for each of the plurality of small nets by the total capacitance;
   (f) approximating an interconnect delay for each of the plurality of small nets by zero; and
   (g) calculating a cell delay from the interconnect delay and the effective capacitance for each of the plurality of small nets.

18. The method of claim 17 wherein step (b) comprises comparing a ratio of a driver resistance to a wire resistance for each of the plurality of nets with a selected minimum ratio.

19. The method of claim 18 wherein the selected minimum ratio is substantially equal to nine.

20. The method of claim 18 wherein step (b) comprises comparing a product of the wire resistance times a total capacitance for each of the plurality of nets with a selected minimum wire delay.

21. The method of claim 20 wherein the selected minimum wire delay is substantially equal to one picosecond.

22. The method of claim 20 further comprising the step of (h) calculating a cell delay and an interconnect delay for a plurality of large nets in the plurality of nets wherein each of the plurality of large nets is not identified as one of the plurality of small nets.

23. The method of claim 22 further comprising the step of (i) generating as output the interconnect delay and the cell delay calculated for each of the plurality of small nets and for each of the plurality of large nets in a Standard Delay Format file.

* * * * *